United States Patent [19]
Yu

[11] Patent Number: 6,127,216
[45] Date of Patent: Oct. 3, 2000

[54] HEAVILY-DOPED POLYSILICON/ GERMANIUM THIN FILM FORMED BY LASER ANNEALING

[75] Inventor: Bin Yu, Fremont, Calif.

[73] Assignee: Advanced Micro Devices, Inc., Sunnyvale, Calif.

[21] Appl. No.: 09/187,881

[22] Filed: Nov. 6, 1998

[51] Int. Cl.[7] .............................................. H01L 21/8234
[52] U.S. Cl. .................. 438/238; 438/305; 438/300; 438/303
[58] Field of Search ............................ 257/413; 438/592, 438/289, 300, 655

[56] References Cited

U.S. PATENT DOCUMENTS

| | | |
|---|---|---|
| 5,290,727 | 3/1994 | Jain ............................................ 437/52 |
| 5,670,397 | 9/1997 | Chang ........................................ 437/34 |
| 5,851,922 | 12/1998 | Bevk ......................................... 438/655 |
| 5,902,125 | 5/1999 | Wu .......................................... 438/300 |

Primary Examiner—David Nelms
Assistant Examiner—Phuc T. Dang
Attorney, Agent, or Firm—Foley & Lardner

[57] ABSTRACT

An ultra-large scale integrated (ULSI) circuit includes MOSFETs which have different threshold voltages and yet have the same channel characteristics. The MOSFETs utilize gate structures with heavily doped polysilicon material or heavily doped polysilicon/germanium material. The polysilicon and polysilicon/germanium materials are manufactured by utilizing amorphouse semiconductor layers. Excimer laser annealing is utilized to activate the dopants and to provide a box-like dopant profile.

20 Claims, 13 Drawing Sheets

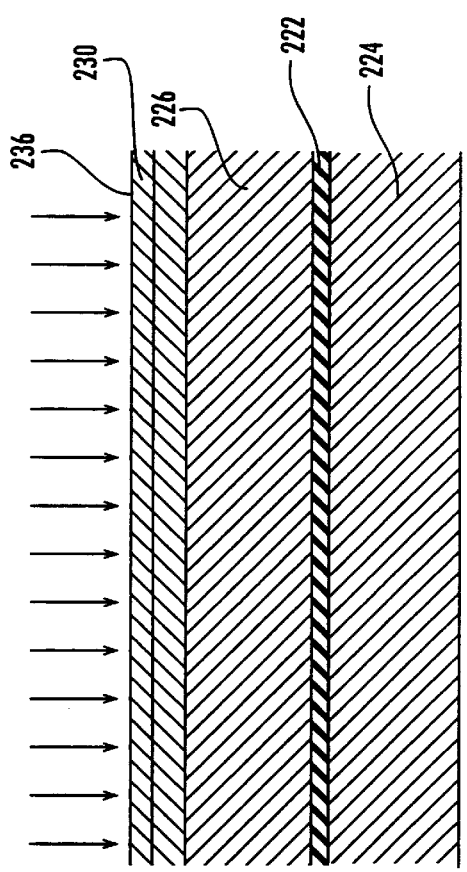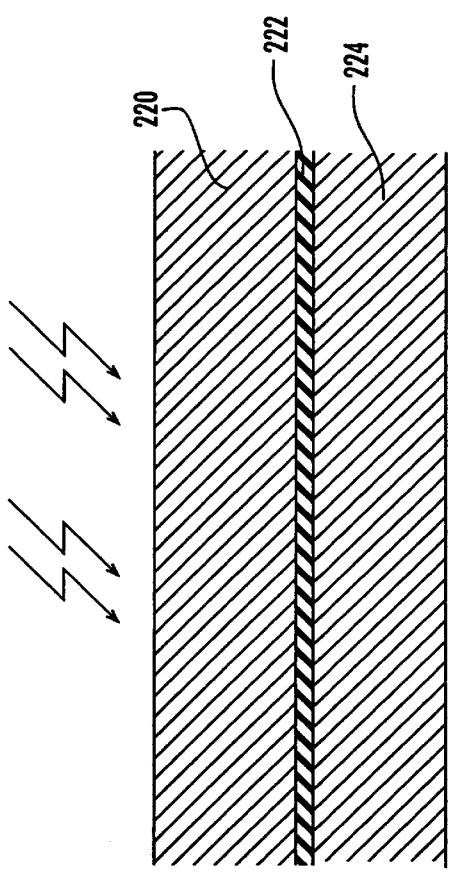

HEAVILY-DOPED POLYSILICON/GERMANIUM THIN FILM FORMED BY LASER ANNEALING

CROSS REFERENCE TO RELATED APPLICATIONS

This application is related to U.S. patent application Ser. No. 09/187,842 (Atty. Dkt. No. 39153-109)., filed on an even date herewith by Yu et al., entitled "Integrated Circuit Having Transistors with Different Threshold Voltages." This application is also related to U.S. patent application Ser. No. 09/187,171 (Atty Dkt. No. 39153-120), filed on an even date herewith by Yu entitled "Multiple Threshold Voltage Transistor Implemented by a Damascene Process." This application is also related to U.S. patent application Ser. No. 09/187,618 (Atty Oct. No. 39153-120), filed on an even date herewith, entitled "Method of Providing a Gate Conductor with High Dopant Activation."

FIELD OF THE INVENTION

The present invention relates generally to an integrated circuit (IC) and the fabrication of an integrated circuit. More particularly, the present invention relates to an integrated circuit having transistors with polysilicon or polysilicon/germanium gate conductors.

BACKGROUND OF THE INVENTION

Ultra-large scale integrated (ULSI) circuits generally include a multitude of transistors, such as, more than one million transistors and even several million transistors on a substrate. The transistors are generally metal oxide semiconductor field effect transistors (MOSFETs) which include a gate conductor disposed between a source region and a drain region. The gate conductor is provided over a thin gate oxide material.

Generally, the gate conductor is a polysilicon or polysilicon/germanium ($Si_xGe_{(1-x)}$) material that controls charge carriers in a channel region between the drain and the source to turn the transistor on and off. The transistors can be N-channel MOSFETs or P-channel MOSFETs.

The polysilicon and polysilicon/germanium gate materials are heavily doped (e.g., P+ or N+) to increase their conductivity. According to conventional processes, the dopant implant projection is positioned at a half-depth of the gate material (i.e., gate electrode) thickness to reduce the possibility of dopant diffusion through the thin gate oxide into the channel. Dopant diffusion through the thin gate oxide can adversely affect the predictability of the design and the operability of the circuit. In conventional processes, dopant distribution and gate material have a Gaussian-like profile (the dopant concentration is greatest in the center of the gate material). Accordingly, the dopant concentration near the gate electrode/gate oxide interface is relatively low. The relatively low dopant concentration near the gate electrode and gate oxide interface results in "gate-depletion effect" which is a major problem in complementary MOS (CMOS) processes which manufacture small-scale transistors.

Conventional processes for fabricating transistors have a limited thermal budget so that shallow junctions can be effectively formed. Shallow junctions are necessary for transistors with very small size in ULSI circuits. Dopant implanted into the gate material is often not sufficiently activated due to the limited thermal budget available. The low electrically activated dopant concentration near the gate material/gate oxide interface, combined with the gate depletion effect, causes higher resistance in the polysilicon or polysilicon/germanium gate material. The higher resistance results in a greater voltage drop between the center of the gate conductor and the gate oxide. The greater voltage drop causes a loss of effective voltage bias, which in turn degrades MOSFET drive current and speed and increases the amount of power consumed by the transistor.

Thus, there is a need for a process which can manufacture a gate conductor having a box-like dopant profile. Further still, there is a need for a gate conductor that has a relatively low thermal budget. Even further still, there is a need for a polysilicon/germanium gate conductor that can be efficiently manufactured.

SUMMARY OF THE INVENTION

The present invention relates to a method of manufacturing an integrated circuit. The method includes providing an amorphous semiconductor layer, providing a shallow dopant implant into the amorphous semiconductor layer, and thermally annealing the amorphous semiconductor layer. The amorphous semiconductor layer is provided over a gate oxide layer on a top surface of a substrate. The amorphous semiconductor layer is transformed into a crystalline layer with electrically active dopants by the thermally annealing step. The dopants preferably have a box-like dopant profile.

The present invention further relates to a method of manufacturing an ultra-large scale integrated circuit that includes a plurality of field effect transistors having a doped gate conductor. The method includes steps of providing an amorphous silicon layer, providing a dopant implant less than 50 nm centered below a top surface of the amorphous silicon layer, and thermally annealing the amorphous silicon layer. The amorphous silicon layer is provided over a gate oxide on a top surface of a silicon substrate.

The present invention still further relates to a method of providing a doped polysilicon/germanium conductor for an integrated circuit. The method includes providing an amorphous silicon layer and an amorphous germanium layer, providing a shallow dopant implant into the amorphous silicon layer and the amorphous germanium layer, and thermally annealing the amorphous silicon layer and the amorphous germanium layer to form the doped polysilicon/germanium conductor.

BRIEF DESCRIPTION OF THE DRAWINGS

The present invention will hereafter be described with reference to the accompanying drawings, wherein like numerals denote like elements, and:

FIG. 6 is a cross-sectional view of a polysilicon/germanium film in accordance with yet another exemplary embodiment of the present invention, the germanium film can be utilized in the portion of the integrated circuit illustrated in FIG. 1;

FIG. 9 is a cross-sectional view of the polysilicon/germanium film illustrated in FIG. 6, showing a dopant implant step;

DETAILED DESCRIPTION OF THE PREFERRED EMBODIMENTS

Figure 1:
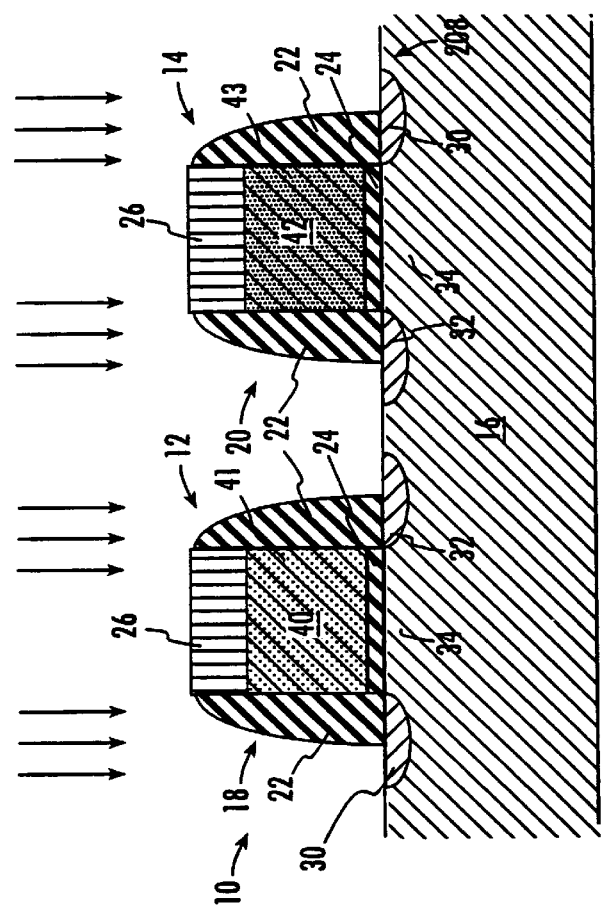
FIG. 1 is a cross-sectional view of a portion of an integrated circuit in accordance with an exemplary embodiment of the present invention.

With reference to FIG. 1, a portion 10 of an integrated circuit (IC) or chip includes a transistor 12 and a second transistor 14. Portion 10 is preferably part of an ultra-large-scale integrated (ULSI) circuit having 1,000,000 or more transistors. Portion 10 is manufactured as part of the IC on a semiconductor wafer, such as, a silicon wafer.

Transistors 12 and 14 are disposed on a substrate 16 that is preferably silicon. Transistor 12 includes a gate stack 18, and transistor 14 includes a gate stack 20. Each of gate stack 18 and gate stack 20 includes sidewall spacers 22, a gate dielectric 24, and a protection layer 26. Protection layer 26 is preferably silicon oxynitride (SiON) or silicon nitride material. Spacers 22 and dielectric 24 can be silicon dioxide or other insulating material. Spacers 22 are deposited as a silicon dioxide layer by chemical vapor deposition (CVD), which is selectively etched. Dielectric 24 is thermally grown. Alternatively, spacers 22 can be a silicon nitride material or other insulative.

Transistors 12 and 14 also both include a drain 30, a source 32, and a channel 34. Channel 34 of transistor 12 has almost identical characteristics to channel 34 of transistor 14. Transistors 12 and 14 are made with the same identical channel implant to avoid short-channel performance degradation. Therefore, additional channel implants are not utilized in the manufacture of portion 10. Transistors 12 and 14 can be N-channel or P-channel transistors.

Gate stack 18 includes a gate conductor 40, and gate stack 20 includes a gate conductor 42. Gate conductors 40 and 42 are preferably manufactured from a semiconductor material, such as, polysilicon, and are doped or implanted with another semiconductor material, such as, germanium. Gate conductors 40 and 42 are also heavily doped with a P-type dopant, such as, boron.

Gate conductor 40 is made from material 41, having a lower concentration of germanium than material 43 of gate conductor 42, as indicated by the lighter shading of gate conductor 40. Consequently, if transistors 12 and 14 are P-channel MOSFETs, transistor 12 has a lower threshold voltage than transistor 14 due to the lower concentration of germanium in material 41. If transistors 12 and 14 are N-channel transistors, transistor 12 has a higher threshold voltage due to the higher concentration of germanium in material 43. Preferably, transistor 12 is utilized in a critical signal path, and transistor 14 is utilized in a non-critical signal path, if transistors 12 and 14 are P-channel transistors.

Exemplary values for transistors 12 and 14 (N-channel) are given below. Transistor 12 has a threshold voltage of approximately 0.32 volts, and transistor 14 has a threshold voltage of approximately 0.2 volts. Material 41 of transistor 12 has a concentration of germanium of approximately 10%, and material 43 of transistor 14 has a concentration of germanium of approximately 40%. The difference in the threshold voltage of transistors 12 and 14 is related to the difference in the germanium concentration between materials 41 and 43, where material 41 is $Si_{(1-x)} Ge_x$ and material 43 is $Si_{(1-y)} Ge_y$. Conversely, if transistors 12 and 14 are P-channel transistors, transistor 12 has a lower threshold voltage than transistor 14.

The threshold voltage is controlled by the work function associated with gate stacks 18 and 20. The work function is related to the fraction of germanium in the polysilicon associated with materials 41 and 43. The germanium composition modifies the valence band level (not the conduction band level) so the work function is decreased as the germanium concentration is increased.

As an example, when transistors 12 and 14 (N-channel) have an identical N-channel implant, and transistor 12 has a 10% molar concentration of germanium in material 41, while transistor 14 has a 40% molar concentration of germanium in material 43, the gate work function associated with transistor 12 is approximately 120 mV greater than that of transistor 14. Therefore, the threshold voltage (Vth) of transistor 12 is 120 mV greater than that of transistor 14. Accordingly, dual-Vth transistors for portion 10 can be designed without changing the channel implant.

Transistors 12 and 14 can be any type of transistor. Most preferably, transistors 12 and 14 are MOSFET transistors and can be either P-channel or N-channel MOSFET transistors. The MOSFET transistors 12 and 14 can have threshold voltages from 0.2 V or less to over 0.7 V. Preferably, the threshold voltage of transistors 12 and 14 is between 0.2 and 0.4 V. Isolation and connections between transistors 12 and 14 are not shown in FIGS. 1–5 for simplicity.

Depending upon the concentration of germanium in materials 41 and 43, the threshold voltage value can be changed within a range. For example, from a 0% germanium concentration to a 60% germanium concentration, the threshold voltage can differ by approximately 240 mV, thereby giving a circuit designer a large window to select threshold voltages for different paths. Further, the design of transistors 12 and 14 with the advantageous gate structure decouples the variation of threshold voltages from parameters of the channel, thereby making transistor design simpler and fabrication less complicated.

Figure 2:
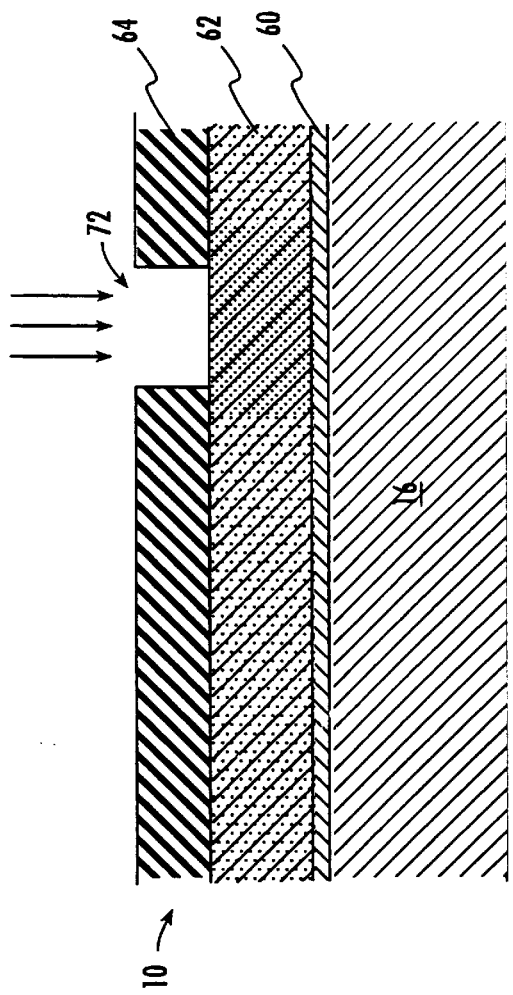
FIG. 2 is a cross-sectional view of the portion of the integrated circuit illustrated in FIG. 1, showing a germanium ion implant step.

With reference to FIGS. 1–4, the fabrication of portion 10, including transistors 12 and 14, is described below as follows. In FIG. 2, portion 10 includes substrate 16 beneath a gate oxide layer 60 that is beneath a polysilicon/germanium layer 62. Layer 62 is substantially covered with a photoresist layer 64.

Substrate 16 is preferably a silicon substrate, and layer 60 is preferably a gate dielectric layer for dielectric 24 (FIG. 1). Layer 60 can be thermally grown silicon dioxide. Layer 62 is a semiconductor material implanted with another semiconductor material, such as, polysilicon/germanium, $Si_{(1-x)}Ge_x$. The concentration of germanium can be zero (x=0). Layer 62 is exposed to germanium ions through an aperture 72 in photoresist layer 64. The region associated with aperture 72 becomes a polysilicon/germanium material doped with more germanium ions, $Si_{(1-y)}Ge_y$, (e.g., material 43 (FIG. 4), where y is greater than x). Layer 62 is doped or implanted with germanium by an ion implantation technique.

Figure 4:
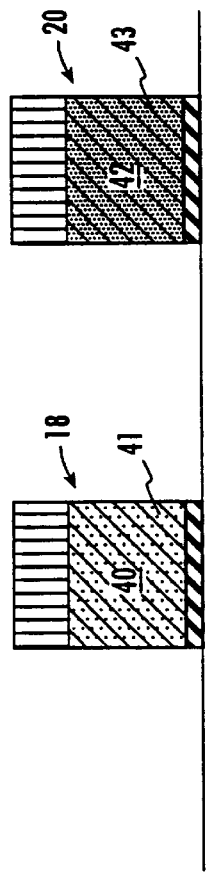
FIG. 4 is a cross-sectional view of the portion of the integrated circuit illustrated in FIG. 1, showing a gate stack formation step.

Layer 62 is deposited on top of layer 60 (FIGS. 2 and 3) by chemical vapor deposition (CVD). After deposition, layer 62 can be heavily doped with boron to become a P+ type material and implanted with germanium by the ion implantation process to become material 41 (FIG. 4). Alternatively, layer 62 could be deposited as doped polysilicon, with germanium already included. Layer 64 is preferably photoresist, and a photolithographic technique is utilized to define aperture 72. Aperture 72 is preferably as wide or slightly wider than stack 20 (FIG. 1).

Figure 3:
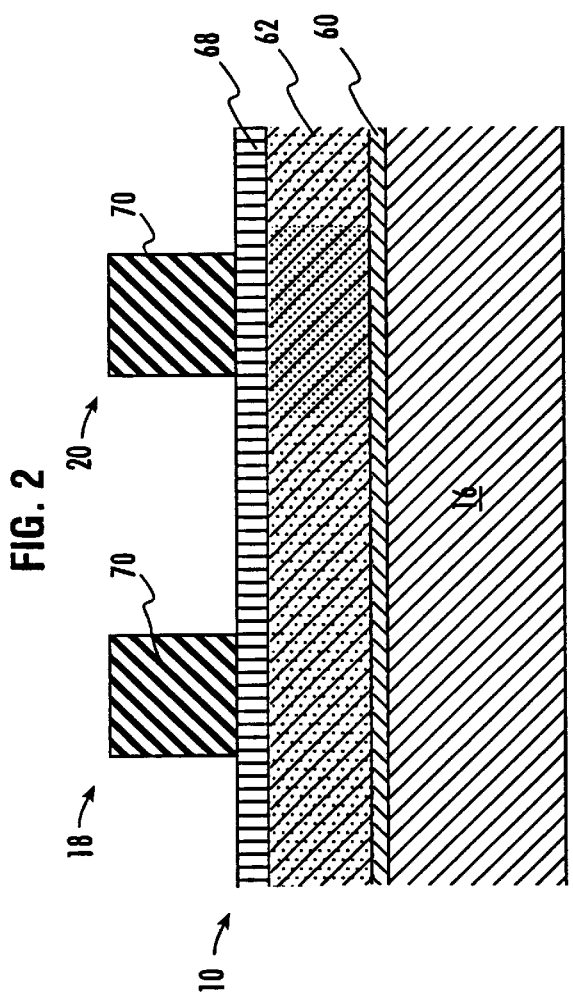
FIG. 3 is a cross-sectional view of the portion of the integrated circuit illustrated in FIG. 1, showing a photoresist removal step.

With reference to FIG. 3, layer 64 is stripped, and a protection layer or barrier layer 68 is deposited over layer 62. Layer 68 can be a silicon oxynitride (SiON) or nitride material. Layer 68 is preferably deposited under low temperature (e.g., less than 400° C.) by CVD.

Layer 68 protects layer 62 for later source and drain implant steps associated with the formation of transistors 12 and 14. Layer 68 also advantageously allows a P+ type gate to be utilized for both N-channel and P-channel MOSFETs. Layer 68 can be doped with boron (P+) when drains 30 and sources 32 are formed for P-channel transistors.

After layer 68 is deposited, a photoresist layer 70 is deposited and selectively etched in accordance with gate stacks 18 and 20. Portion 10 is plasma-etched or dry-etched to form gate stacks 18 and 20 (FIG. 1 and FIG. 4). In FIG. 4, after etching, layer 70 is removed. Gate stack 18 includes material 41, and gate stack 20 includes material 43. Gate stacks 18 and 20 can be formed by a variety of fabrication techniques. With reference to FIG. 1, conventional transistor processes can be utilized to form drains 30, sources 32, contacts, and interconnectors for portion 10.

Alternatively, conductors 40 and 42 could be doped in accordance with an amorphous silicon process as discussed below with reference to FIGS. 6–9, where a germanium layer is provided on top of a silicon layer. The germanium and silicon layers are subjected to an amorphization process and melted to form conductors 40 and 42 as polysilicon material doped with germanium. In an other alternative, conductors 40 and 42 can be formed in a damascene process as discussed below with reference to FIGS. 15–20. In this process, dummy polysilicon conductors are removed and replaced with polysilicon conductors that are selectively doped with germanium.

Figure 5:
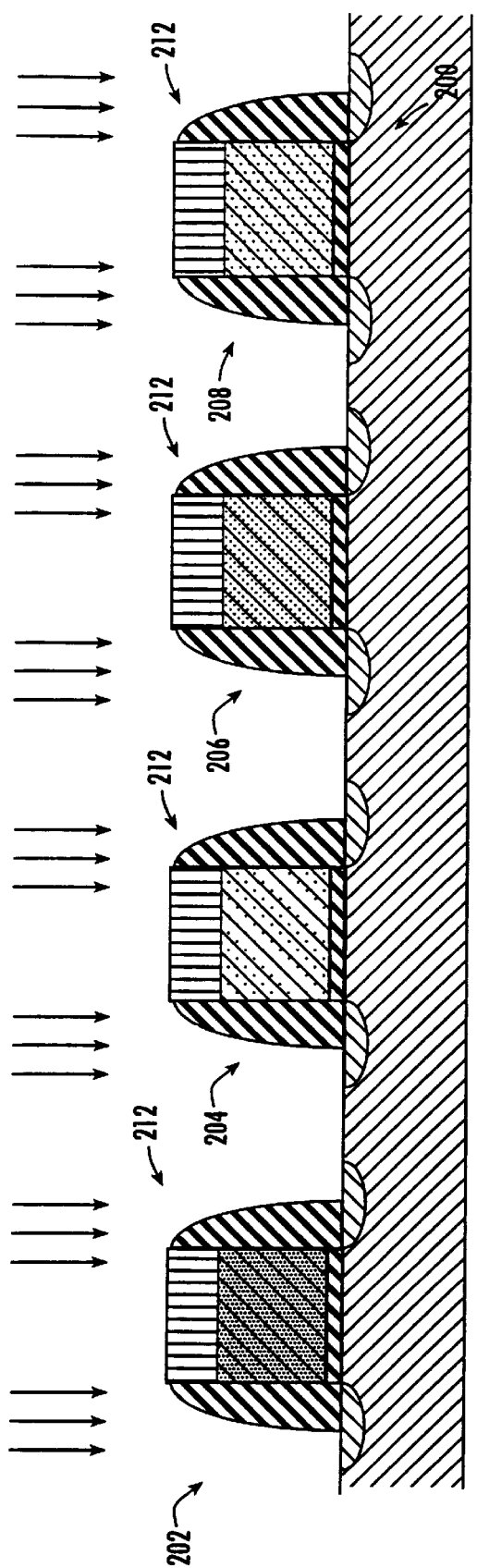
FIG. 5 is a cross-sectional view of a portion of another integrated circuit in accordance with another exemplary embodiment of the present invention.

With reference to FIG. 5, a portion 200 of an IC includes transistors 202, 204, 206, and 208 (N-channel or P-channel), which are fabricated in accordance with a similar process described with reference to FIGS. 1–4. Assuming transistors 202, 204, 206, and 208 are N-channel devices, the threshold voltage associated with transistor 202 is lower than the threshold voltages of transistors 204, 206, and 208. The threshold voltage of transistor 204 is higher than the threshold voltages of transistors 206 and 208. Transistor 208 has a higher threshold voltage than transistor 206. Thus, portion 200 includes transistors having four different threshold voltages. Threshold voltages of transistors 202, 204, 206, and 208 are controlled by the amount of germanium concentration in gate structures 212 associated with transistors 202, 204, 206, and 208. Unlike the process described in FIGS. 1–4, several germanium implantation steps are necessary to appropriately implant gates 212. The implant steps require several photoresist masks to appropriately provide the correct concentrations of germanium in gates 212.

With reference to FIG. 6, a polysilicon/germanium film 220 can be utilized on portion 10 (FIG. 1) and on portion 200 (FIG. 5) as a gate conducting material, such as, materials 41 and 43. Alternatively, film 220 can be utilized in other conductive positions of the integrated circuit. Film 220 is provided over a gate oxide layer 222 that is provided over a silicon substrate 224.

Film 220 is preferably a heavily doped polysilicon/germanium film that can be doped with N-type dopants or P-type dopants. Additionally, film 220 preferably has a box-like dopant profile and is preferably a $Si_{(1-x)}Ge_x$ material, where x is the molar concentration of germanium.

Figure 7:
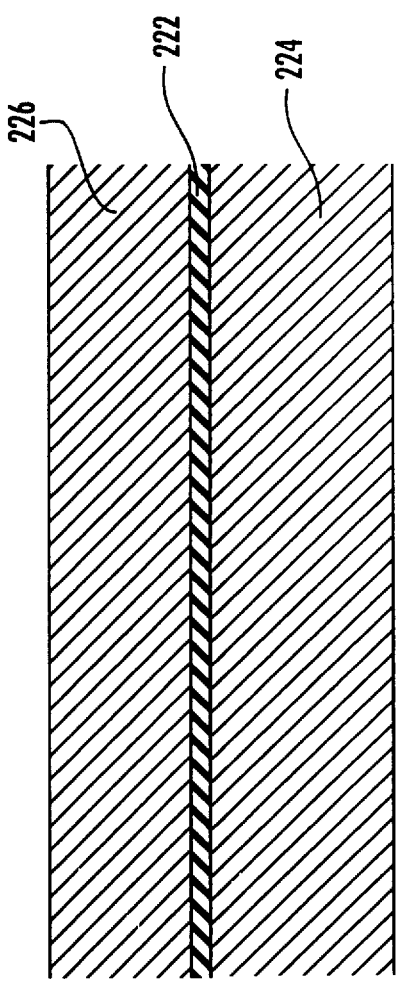
FIG. 7 is a cross-sectional view of the polysilicon/germanium film illustrated in FIG. 6, showing an amorphous silicon deposition step.

With reference to FIGS. 6–9, the manufacture of film 220 is described below as follows. In FIG. 7, an amorphous silicon layer 226 is deposited by low pressure chemical vapor deposition (LPCVD) on top of layer 222. Layer 226 is preferably between 100 nm and 200 nm thick and is deposited at a temperature below 500° C. Layer 226 has a smaller crystal size than film 220 (FIG. 6). Layer 222 can be a 2–4 nm oxide layer, a 30–50 nm thick nitride layer, or other dielectric layer.

Figure 8:
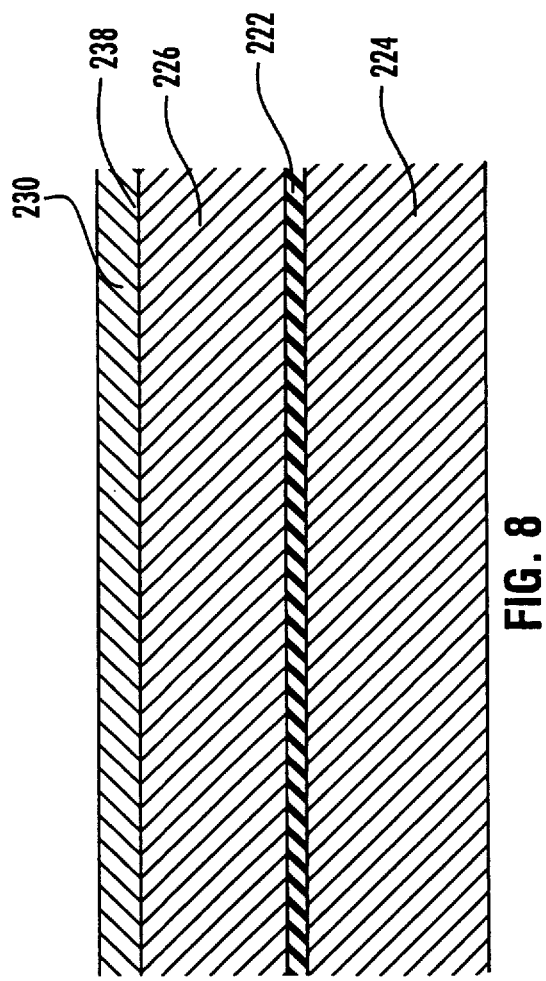
FIG. 8 is a cross-sectional view of the polysilicon/germanium film illustrated in FIG. 6, showing an amorphous germanium deposition step film.

With reference to FIG. 8, an amorphous germanium layer 230 is deposited by LPCVD over a top surface 238 of layer 226. Layer 230 is preferably a thin layer of amorphous germanium deposited at a temperature below 500° C. Preferably, layer 230 is between 10 and 20 percent of the total thickness of layers 230 and 226 (e.g., between 10 and 40 nm). The thickness of layers 226 and 230 can be dependent upon the desired composition of film 220 (e.g., the value for x). Accurate control of germanium concentration can be obtained by adjusting the thickness ratio between layers 226 and 230.

With reference to FIG. 9, layers 226 and 230 are subjected to a dopant implant. A dopant, such as, arsenic, phosphorus, boron, or boron difluoride ($BF_2$), can be implanted about surface 238 (FIG. 8). Preferably, the implant is performed under small implant energy so the projection is relatively shallow below a top surface 236 of layer 230. Multiple implants using different types of dopants can be utilized to increase the dopant concentration within layers 226 and 230, until a level close to the solid solubility limit of layers 226 and 230 is reached. The dopants are preferably implanted in an ion implantation process, wherein the peak of the dopant concentration is centered approximately one-quarter of the thickness of the combination of layers 226 and 230 (e.g., below surface 236 by 25–50 nm). The implant is sufficiently shallow to avoid significant dopant tail effect into layer 222.

With reference to FIG. 6, layers 226 and 230 (FIG. 9) are subjected to an excimer laser annealing process to melt layers 226 and 230. During the laser annealing, dopants diffuse evenly throughout film 220 in a box-like profile. The laser annealing process also electrically activates dopants in layers 226 and 230 (FIG. 9) at the same time. The excimer laser annealing process preferably heats layers 226 and 230 above the melting point of amorphous silicon (e.g., 900° C.). Preferably, annealing provides a local temperature above the melting point of amorphous germanium (between approximately 950° C. and 1000° C.).

After the laser annealing step, film 220 is recrystalized as polysilicon with electrically activated impurities. The excimer laser annealing process activates the dopants more quickly than conventional thermal annealing processes. Alternatively, other annealing, thermal, or heating processes can be utilized to activate and diffuse dopants.

The method discussed with reference to FIGS. 6–9 advantageously provides a uniform dopant and germanium profile in film 220. Unlike conventional processes, in which the dopant distribution and the gate material has a Gaussian-like profile, and the physical dopant concentration near the gate electrode/gate oxide interface is relatively low, film 220 obtains a uniform box-like dopant profile. The evenly distributed germanium profile in film 220 is independent of subsequent thermal steps. A stable germanium composition near the gate oxide interface (interface between gate oxide layer 222 and film 220) is advantageously achieved, and gate depletion effect is minimized.

Figure 10:
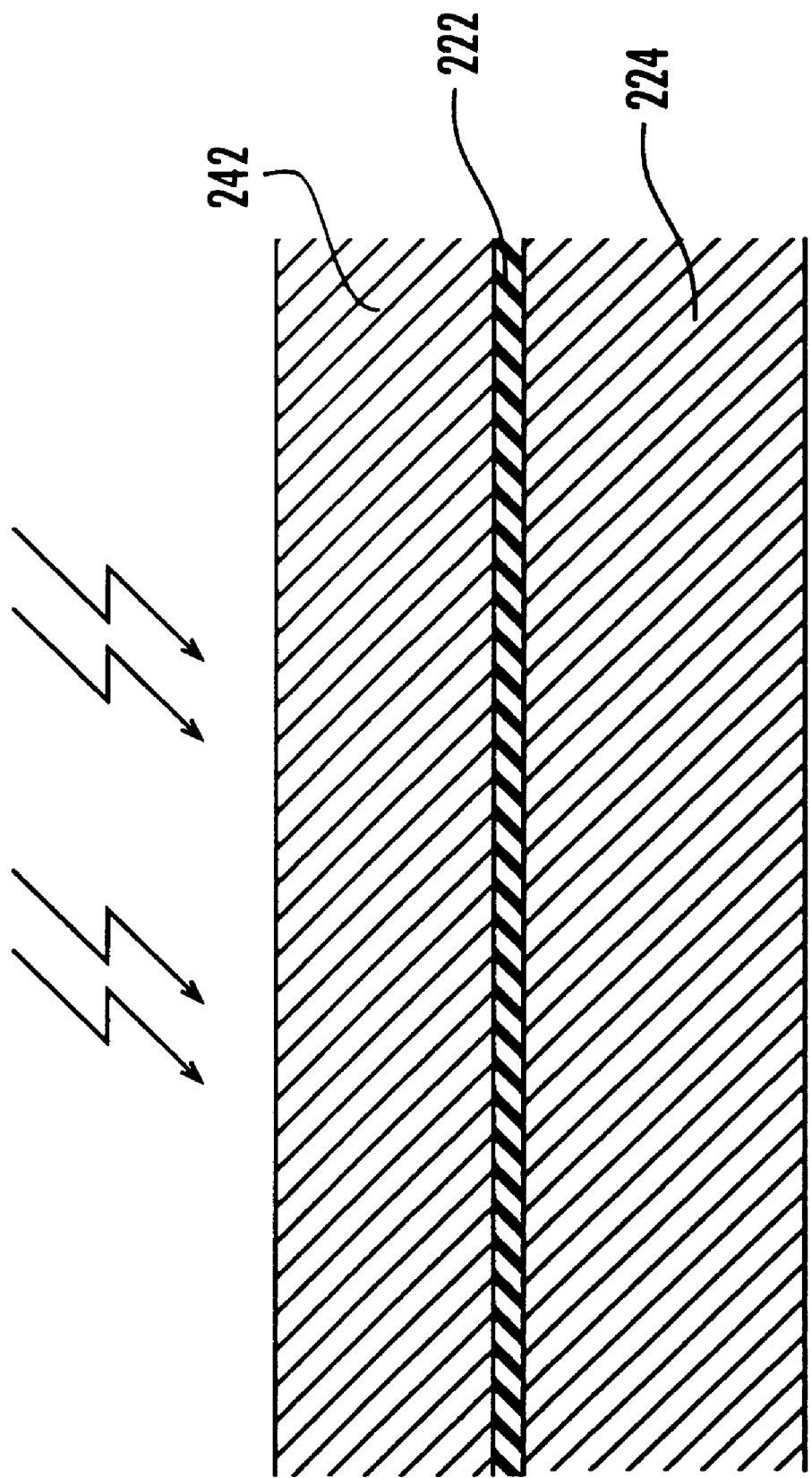
FIG. 10 is a cross-sectional view of a polysilicon film in accordance with still another exemplary embodiment of the present invention, the polysilicon film can be utilized in the portion of the integrated circuit illustrated in FIG. 1.

With reference to FIG. 10, a film of a polysilicon film 242 is similar to polysilicon/germanium film 220 discussed with reference to FIGS. 6–9. Film 242 can be manufactured in a process similar to the process used to manufacture film 220. However, film 242 does not include germanium. Film 242 is provided on layer 222, which is provided on substrate 224. Film 242 has a box-like profile of evenly diffused dopant. Film 220 can be utilized in portion 10 or in portion 200, discussed with reference to FIGS. 1 and 5.

Figure 11:
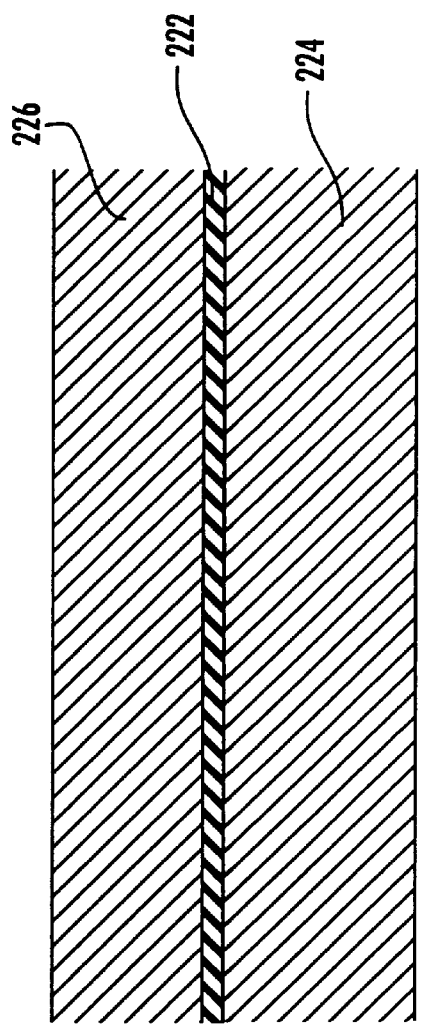
FIG. 11 is a cross-sectional view of the polysilicon film illustrated in FIG. 10, showing an amorphous silicon deposition step.

The manufacture of film 242 is discussed below with reference to FIGS. 10–12. In FIG. 11, an amorphous silicon layer 226 is deposited by LPCVD on top of layer 222. Layer 226 is preferably 100 nm–200 nm thick and deposited at a temperature of below 500° C.

Figure 12:
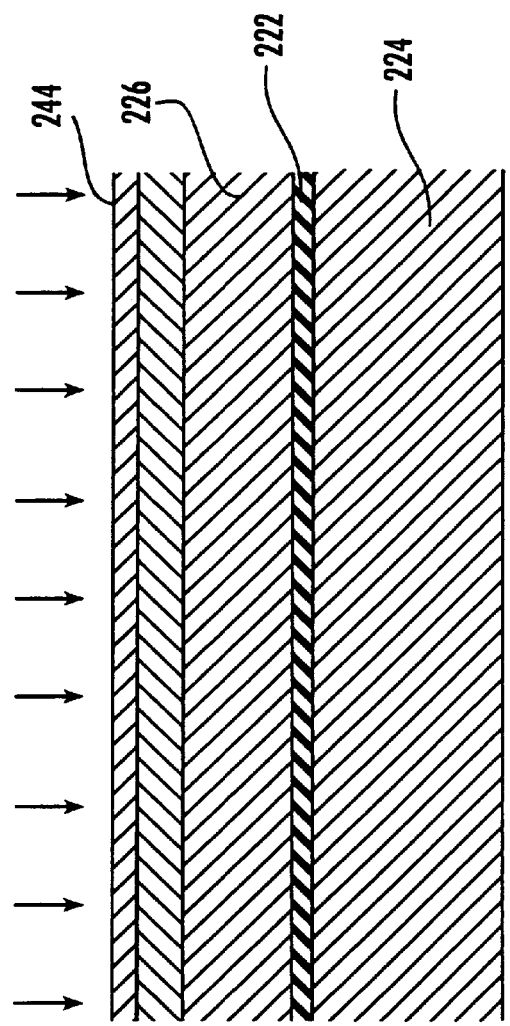
FIG. 12 is a cross-sectional view of the polysilicon film illustrated in FIG. 1, showing a dopant implant step.

In FIG. 12, layer 226 receives a dopant implant. The dopant implant is preferably provided at a shallow projection. Multiple implants can be utilized to increase the dopant concentration until layer 226 is close to its solid solubility limit. Preferably, the dopant region is centered about the thickness of layer 226, below a top surface 244. The dopant implant is sufficiently shallow to avoid dopant tail effect into layer 222 (approximately 25 to 50 nm below surface 244).

With further reference to FIG. 10, layer 226 (FIG. 9) is subject to excimer laser annealing to melt layer 226. The excimer laser annealing diffuses dopant evenly through film 242 in a box-like profile. The excimer laser annealing preferably provides a local temperature between 900° C. and 1000° C. for film 242, thereby activating electrically activating dopants. Film 242 is recrystalized as polysilicon after heating. Alternatively, films 220 and 242 could be heated by other processes to activate dopants and to recrystalize films 220 and 242.

Figure 13:
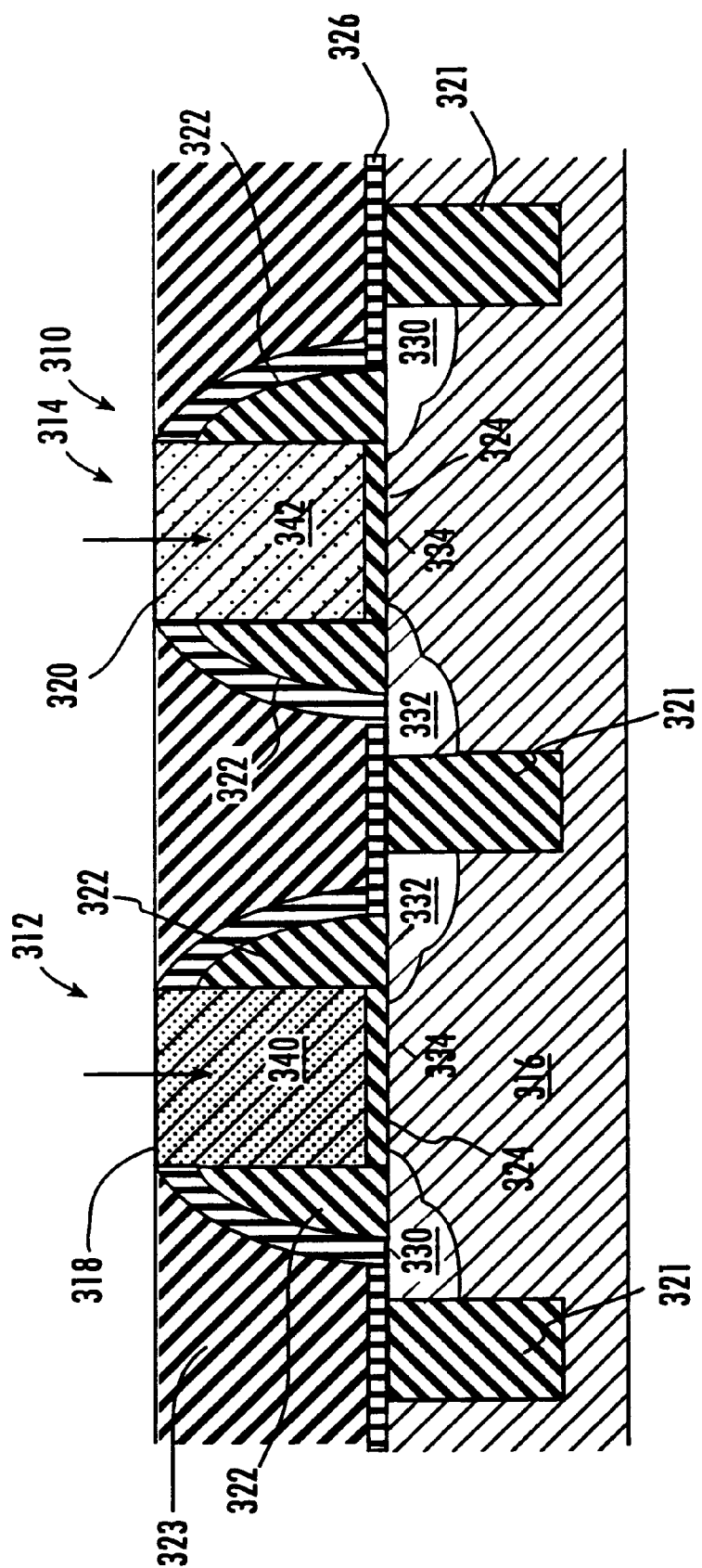
FIG. 13 is a cross-sectional view of a portion of yet another integrated circuit in accordance with still yet another exemplary embodiment of the present invention.

With reference to FIG. 13, a portion 310 of an IC or chip includes a transistor 312 and a transistor 314. Portion 310 is preferably part of a ULSI circuit and can be similar to portion 10 (FIG. 1).

Transistors 312 and 314 are disposed on a substrate 316 that is preferably silicon. Transistor 312 includes a gate stack 318, and transistor 314 includes a gate stack 320. Each of gate stack 318 and gate stack 320 includes sidewall spacers 322, a gate dielectric 324, and a protection or barrier layer 326. Protection layer 326 is preferably a $SiO_xN_y$ layer that is utilized as a polish stopper. An insulative layer 323 is deposited over protection layer 326. Layer 323 can be silicon dioxide deposited in a tetraorthosilicate (TEOS) process.

Transistors 312 and 314 both include a drain 330, a source 332, and a channel 334. Channel 334 of transistor 312 has almost identical characteristics to channel 334 of transistor 314. Transistors 312 and 314 are made with the same identical channel implant to avoid short-channel performance degradation and can be similar to transistors 12 and 14 (FIG. 1). Transistors 312 and 314 are separated by shallow isolation trenches 321.

Gate stack 318 includes a gate conductor 340, and gate stack 320 includes a gate conductor 342. Gate conductors 340 and 342 are preferably manufactured from a semiconductor material, such as, polysilicon, and are both implanted with another semiconductor material, such as, germanium. Gate conductors 340 and 342 are also heavily doped with a P-type dopant, such as, boron. Gate conductor 340 has a higher concentration of germanium than gate conductor 342, as indicated by the lighter shading of gate conductor 342.

Consequently, if transistors 312 and 314 are P-channel MOSFETs, transistor 314 has a lower threshold voltage than transistor 312 due to the lower concentration of germanium in conductor 342. If transistors 312 and 314 are N-channel transistors, transistor 314 has a higher threshold voltage due to the higher concentration of germanium in conductor 340. Transistors 312 and 314 can have similar exemplary values, as described with reference to transistors 12 and 14 in FIGS. 1–5.

Figure 14:
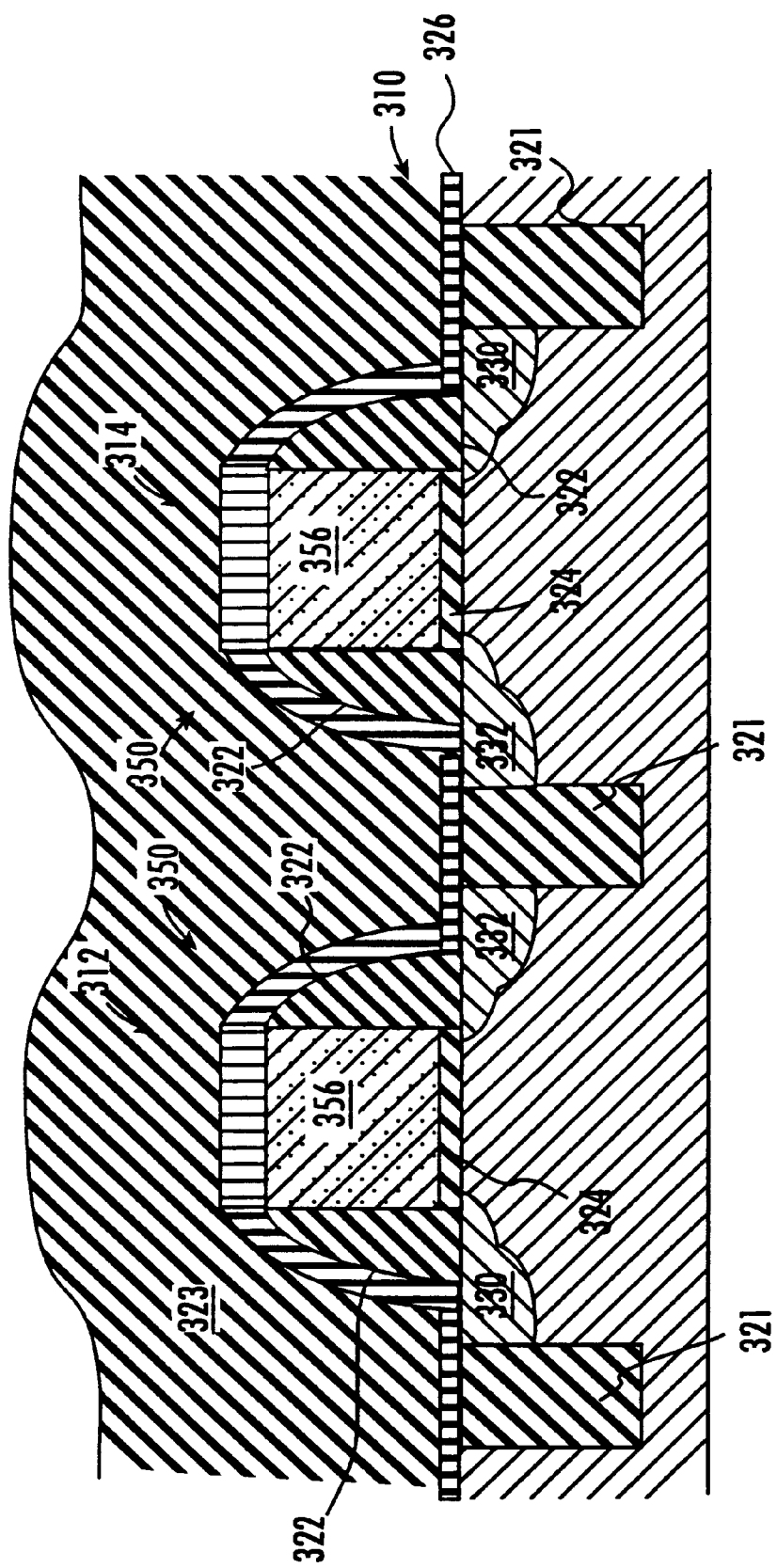
FIG. 14 is a cross-sectional view of the portion of the integrated circuit illustrated in FIG. 13, showing dummy gate structures.

With reference to FIGS. 13–18, the fabrication of portion 310, including transistor 312 and 314, is described below as follows. In FIG. 14, portion 310 includes transistors 312 and 314 having dummy gate structures or stacks 350. Dummy gate stacks 350 include an undoped polysilicon material 356, dielectric 324, and spacers 322. Alternatively, material 356 can be other types of semiconductor materials. Stacks 350 are covered by barrier layer 326 made of siliconoxynitride ($SiO_xN_y$), which is overcoated by an insulative layer 323. Layer 323 can be an oxide layer. Transistors 312 and 314, including stacks 350, can be fabricated according to conventional processes.

Figure 15:
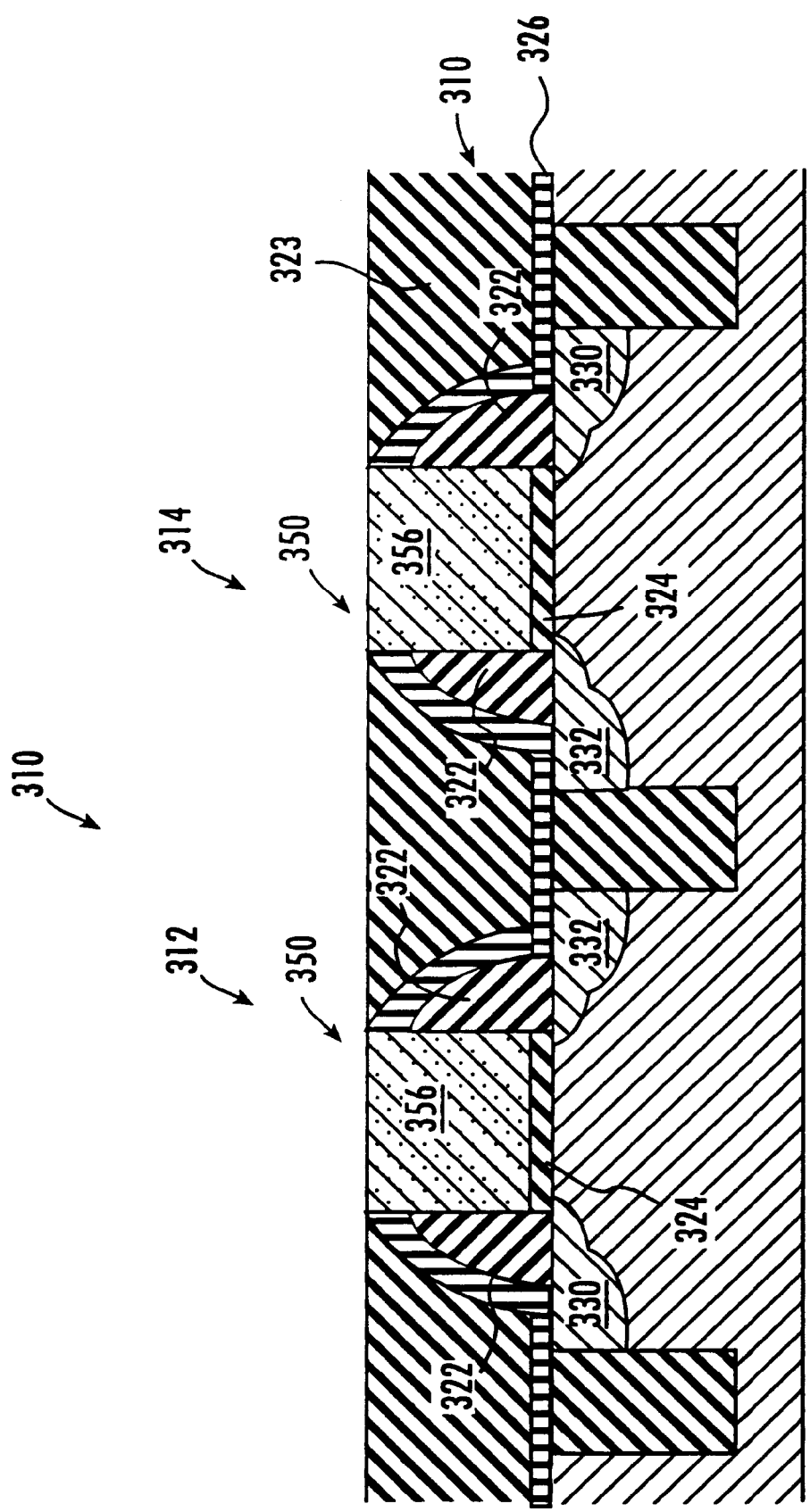
FIG. 15 is a cross-sectional view of the portion of the integrated circuit illustrated in FIG. 13, showing a chemical-mechanical polish (CMP) step.
Figure 16:
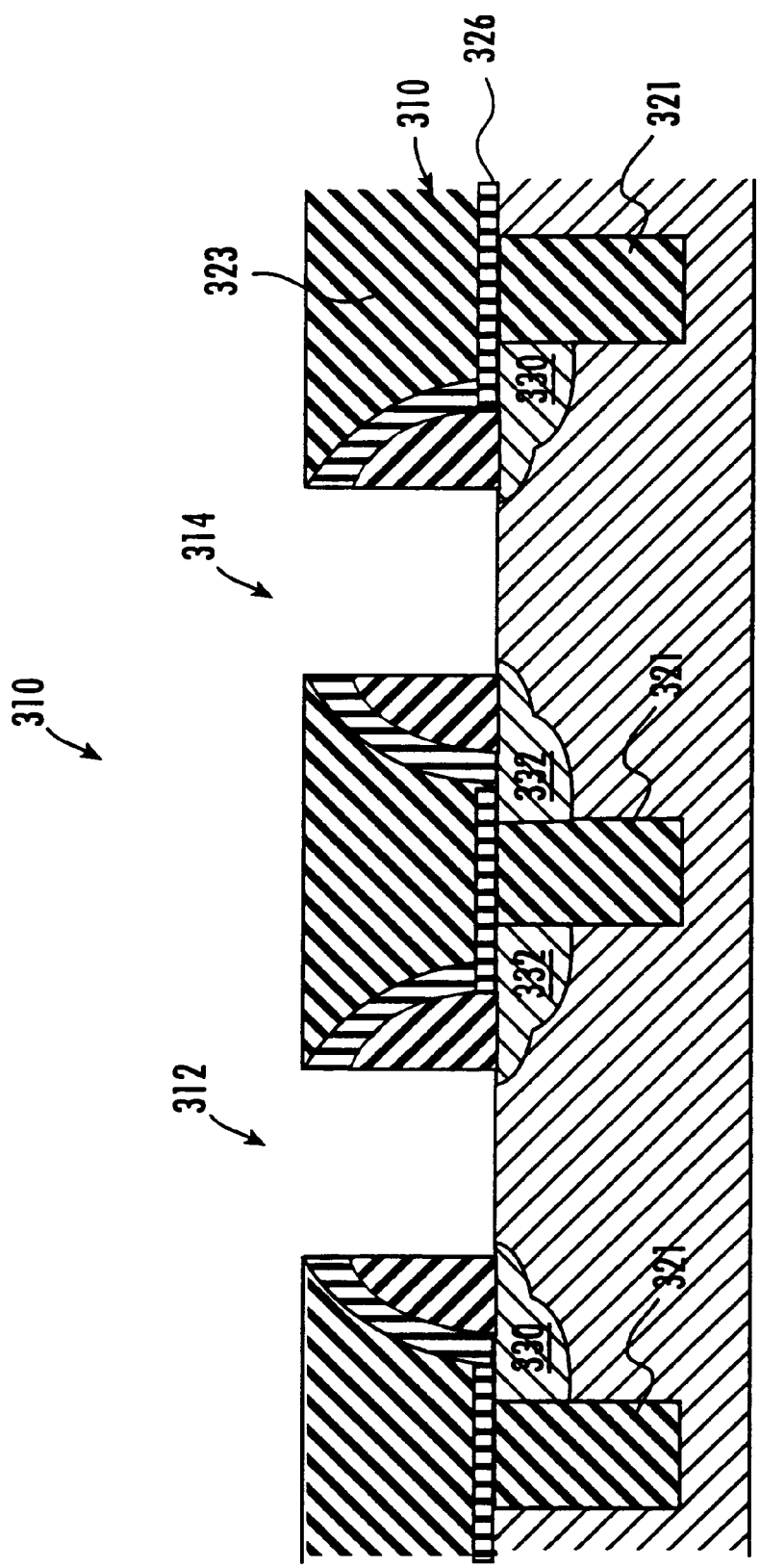
FIG. 16 is a cross-sectional view of the portion of the integrated circuit illustrated in FIG. 13, showing a wet-etching step.
Figure 17:
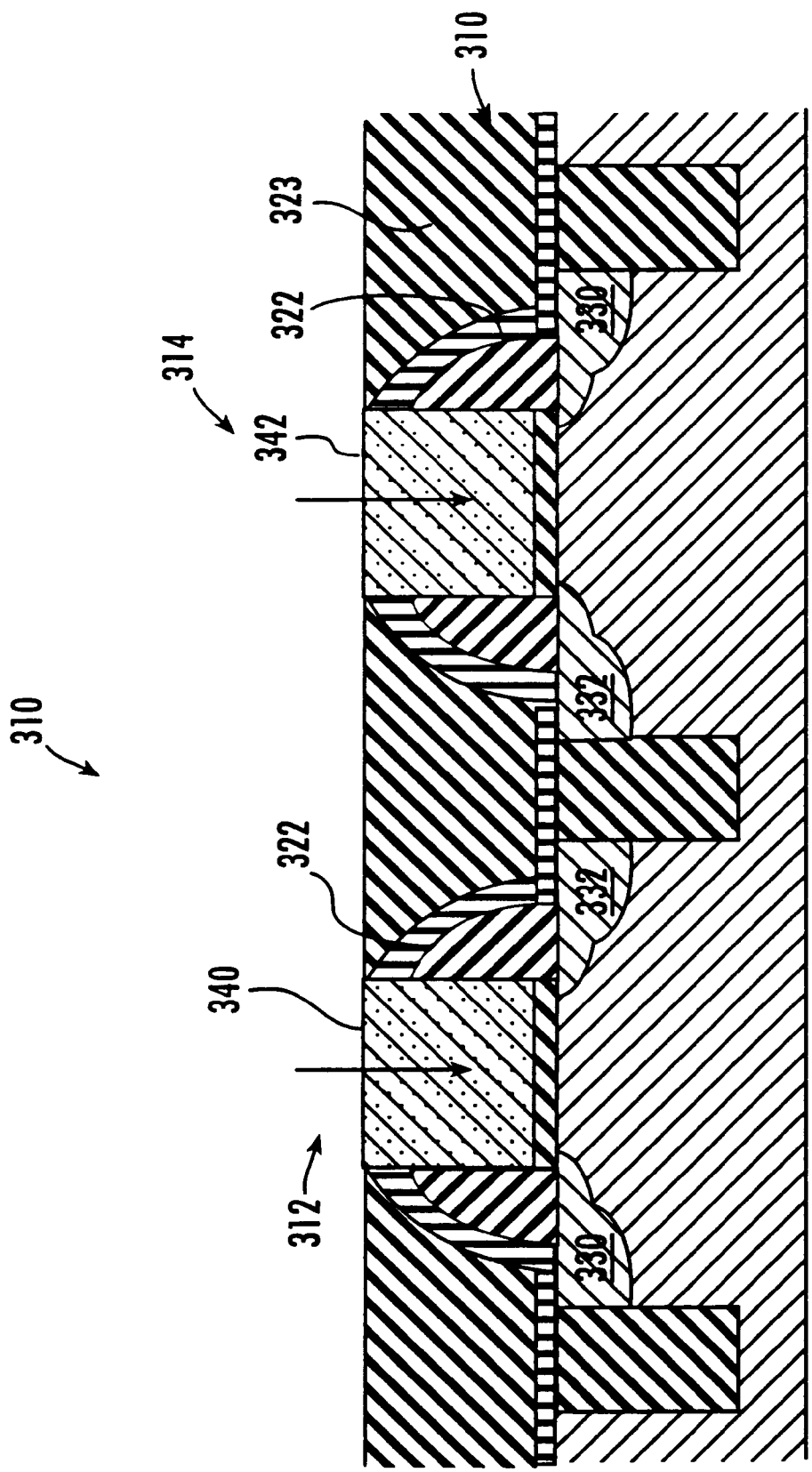
FIG. 17 is a cross-sectional view of the portion of the integrated circuit illustrated in FIG. 13, showing a refill step.

In FIG. 15, portion 310 is subject to a chemical-mechanical polish (CMP) to remove a portion of insulative layer 323. Portion 310 is subject to the CMP until layer 323 is removed from the top of dummy stacks 350. In FIG. 16, polysilicon material 356 is removed by wet-etching selective to polysilicon. Alternatively, dry-etching or other stripping techniques can be utilized to remove polysilicon material 356 from dummy stacks 350. In FIG. 17, gate conductors 340 and 342 are provided in-situ for transistors 312 and 314, respectively. Preferably, P+-type doped polysilicon/germanium is deposited and etched back to leave a form of conductors 340 and 342 between spacers 322. Alternatively, polysilicon can be deposited and implanted with germanium.

Figure 18:
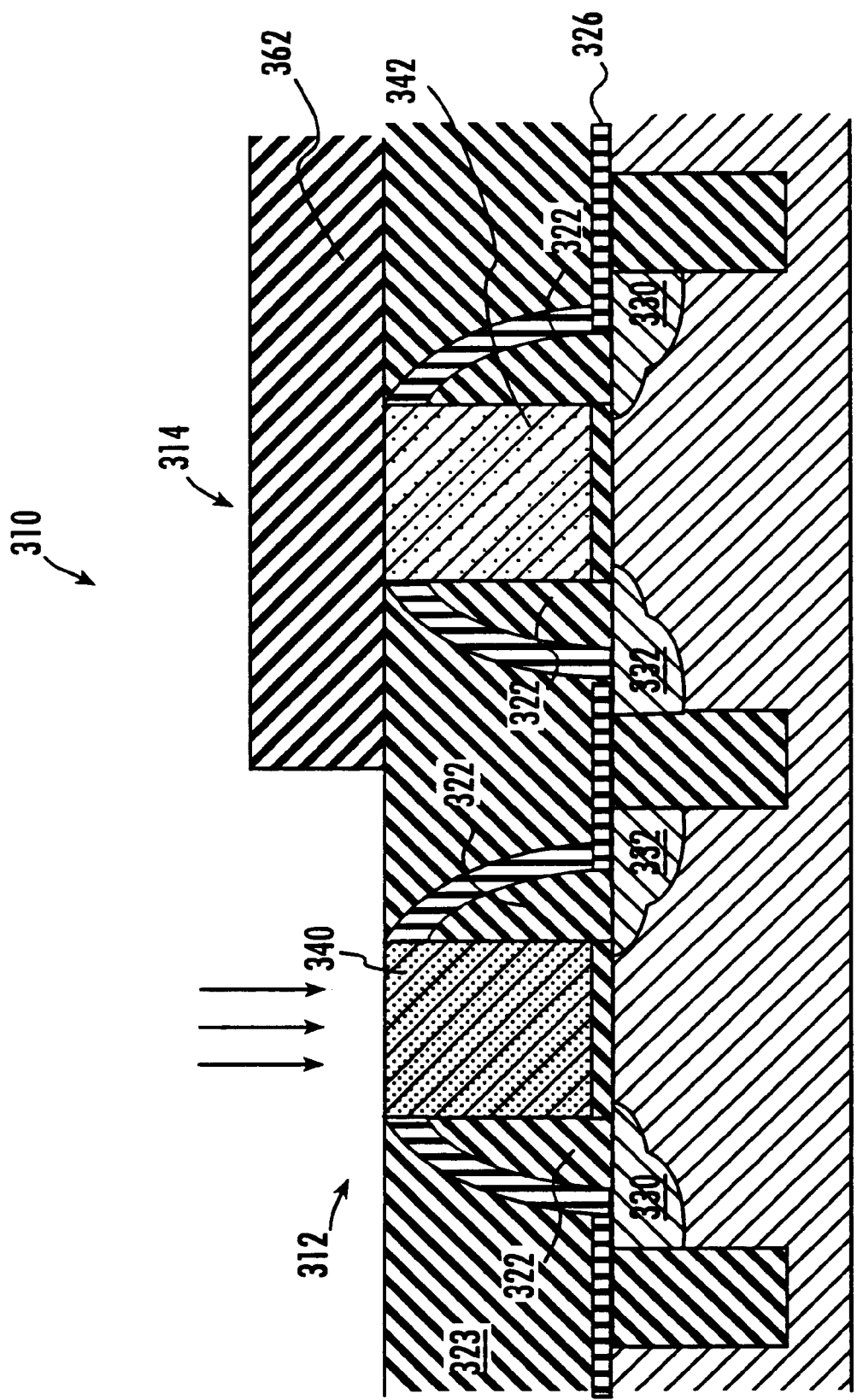
FIG. 18 is a cross-sectional view of the portion of the integrated circuit illustrated in FIG. 13, showing a germanium implantation step.

With reference to FIG. 18, transistor 314 is covered by a photoresist layer 362. After transistor 314 is covered, gate conductor 340 associated with transistor 312 is implanted with germanium ions to a concentration so that conductor 340 is composed of a $Si_{(1-y)}Ge_y$ material, and conductor 342 is composed of a $Si_{(1-x)}Ge_x$ material, where y is greater than x. Alternatively, in FIG. 17, conductors 340 and 342 can be provided as undoped polysilicon and doped in subsequent steps. Additionally, in FIG. 18, a photoresist layer similar to layer 362 can be provided over transistor 314 and ion (e.g., germanium) implantation can be provided to conductor 342. In still further alternatives, conductors 340 and 342 can be provided as films 220 and 242 (FIG. 6 and FIG. 10, respectively).

It is understood that while the detailed drawings, specific examples, and particular values given provide a preferred exemplary embodiment of the present invention, the preferred exemplary embodiment is for the purpose of illustration only. The method and apparatus of the invention are not limited to the precise details and conditions disclosed. For example, although particular polysilicon gate structures are described, other types can be utilized. Various changes may be made to the details disclosed, without departing from the spirit of the invention, which is defined by the following claims.

What is claimed is:

1. A method of manufacturing an integrated circuit, comprising:

providing an amorphous semiconductor layer over a gate oxide layer on a top surface of a substrate;

providing a shallow dopant implant into the amorphous semiconductor layer; and thermally annealing the amorphous semiconductor layer to form a crystalline layer with electrically active dopants, whereby the dopants have a box-like dopant profile.

2. The method of claim 1 further comprising:

providing a second amorphous semiconductor layer over the amorphous semiconductor layer.

3. The method of claim 1 further comprising:

providing a second shallow dopant implant into the amorphous semiconductor layer.

4. The method of claim 3, wherein the second shallow dopant implant includes first dopants, and the second shallow implant includes second dopants.

5. The method of claim 4, wherein the thermal annealing step is an excimer laser annealing step.

6. The method of claim 1, wherein the amorphous semiconductor layer is silicon.

7. The method of claim 2, wherein the second amorphous silicon layer is germanium.

8. The method of claim 7, wherein the crystalline layer is a polysilicon/germanium layer.

9. The method of claim 1, wherein the shallow implant is 10 to 20 percent of a thickness of the amorphous semiconductor layer below a top surface of the amorphous semiconductor layer.

10. A method of manufacturing an ultra-large scale integrated circuit including a plurality of field effect transistors having a doped gate conductor, the method comprising steps of:

providing an amorphous silicon layer over a gate oxide on a top surface of a silicon substrate;

providing a dopant implant less than 50 nm centered below a top surface of the amorphous silicon layer; and thermally annealing the amorphous silicon layer.

11. The method of claim 10, wherein the dopant is at least one of As, B, P, In, or $BF_2$.

12. The method of claim 10, wherein the dopant is at least two of As, B, P, In, or $BF_2$.

13. The method of claim 10, wherein the thermally annealing step is an excimer laser annealing step.

14. The method of claim 13, wherein the thermal annealing step heats the amorphous silicon layer to approximately 900° C.

15. The method of claim 11 further comprising:

providing an amorphous germanium layer over the amorphous silicon layer.

16. A method of providing a doped polysilicon/germanium conductor for an integrated circuit, the method comprising:

providing an amorphous silicon layer and an amorphous germanium layer;

providing a shallow dopant implant into the amorphous silicon layer and the amorphous germanium layer; and thermally annealing the amorphous silicon layer and the amorphous germanium layer to form the doped polysilicon/germanium conductor.

17. The method of claim 16, wherein dopants in the conductor have a box-like profile.

18. The method of claim 17, wherein the amorphous silicon layer is 100 to 200 nm thick.

19. The method of claim 18, wherein the amorphous germanium layer is 10 to 20 nm thick.

20. The method of claim 17, wherein the thermal annealing includes excimer laser annealing.

* * * * *